United States Patent [19]

Nagamatsu et al.

[11] Patent Number: 4,769,270
[45] Date of Patent: Sep. 6, 1988

[54] SUBSTRATE FOR A PRINTED CIRCUIT BOARD

[75] Inventors: Hiroshi Nagamatsu; Kaname Iwasaki, both of Hiratsuka, Japan

[73] Assignee: Mitsubishi Plastics Industries Limited, Tokyo, Japan

[21] Appl. No.: 41,490

[22] Filed: Apr. 23, 1987

[30] Foreign Application Priority Data

Apr. 25, 1986 [JP] Japan .................................. 61-96114

[51] Int. Cl.⁴ ........................ B32B 3/10; B32B 3/00; D03D 3/00; H05K 1/00
[52] U.S. Cl. .................................. 428/131; 428/209; 428/206; 428/224; 428/901; 174/68.5
[58] Field of Search ............... 428/131, 209, 901, 195, 428/196, 206, 224, 539.5; 174/68.5; 524/592

[56] References Cited

U.S. PATENT DOCUMENTS

| 3,914,472 | 10/1975 | Nakonishi et al. | 427/250 |
| 4,360,360 | 11/1982 | Smith | 524/592 |
| 4,491,622 | 1/1985 | Butt | 428/632 |
| 4,496,793 | 1/1985 | Hanson et al. | 174/68.5 |
| 4,522,667 | 6/1985 | Hanson et al. | 156/87 |
| 4,559,264 | 12/1985 | Hoda et al. | 428/324 |
| 4,594,311 | 6/1986 | Frisch et al. | 430/315 |
| 4,601,916 | 7/1986 | Arachtingi | 427/97 |
| 4,679,122 | 7/1987 | Belke, Jr. et al. | 361/414 |

Primary Examiner—John E. Kittle
Assistant Examiner—Patrick J. Ryan
Attorney, Agent, or Firm—Oblon, Fisher, Spivak, McClelland & Maier

[57] ABSTRACT

A substrate for a printed circuit board, comprising a metal core plate having apertures and an inorganic fiber cloth impregnated with a heat resistant thermoplastic resin, coated thereon, wherein said apertures are filled with a mixture of said resin and an inorganic filler.

13 Claims, 2 Drawing Sheets

SUBSTRATE FOR A PRINTED CIRCUIT BOARD

The present invention relates to a substrate for a printed circuit board, especially for a multilayer printed circuit board.

A metal core printed circuit board comprises a metal core plate, an insulating layer formed thereon and a conductive circuit layer formed on the insulating layer, and it is excellent in the heat dissipation property or in the magnetic shielding property, and has been used for various applications including hybrid IC boards.

Heretofore, as shown by the cross-sectional view in FIG. 4, the substrate for such a metal core printed circuit board used to be produced by heat-pressing an epoxy resin-impregnated glass fiber mat (glass epoxy) 8 to a metal core plate 1 provided with a number of apertures 11 to cover the surface of the core plate 1, and at the same time, the impregnated epoxy resin is introduced into the apertures 11 to cover the surface of the apertures 11.

Further, a multilayer printed circuit board has been proposed for the purpose of accomplishing a high density circuitry. Such a multilayer printed circuit board is prepared usually by alternately laminating a copper clad board prepared by forming a conductive pattern on one side or both sides of an insulating substrate, and an adhesive layer, and heat-pressing the laminate for integration. Also in such a case, it is common that the insulating substrate and the adhesive layer are made of the above-mentioned glass epoxy or a glass imide obtained by impregnating a polyimide resin to a glass fiber mat.

However, as shown in FIG. 4, in the substrate wherein such glass epoxy or glass imide is used, foams 12 are likely to remain on the surface of apertures 11, and insulating failure is likely to result when through holes are formed within the apertures 11. Further, it is difficult to adequately introduce glass fibers into apertures 11, whereby when through hole plating is conducted, no adequate adhesion between the plated layer and the inner wall of the through holes will be obtained. Furthermore, the thermal expansion coefficient of the resin in the apertures 11 tends to be greater than that of the insulating layer 2 covering the surface of the core plate 1, and sink marks corresponding to the apertures 11 are likely to form on the surface of the insulating layer obtained by cooling after the heating.

When the metal core printed circuit board or multilayer printed circuit board made of such glass epoxy or glass imide is used in a high frequency region (at a level of megahertz to gigahertz), the dielectric property will be so poor that it will not meet the desirability for a high speed operation of an electric circuit. Thus, a substrate with a higher performance in a high frequency region has been desired.

It is an object of the present invention to provide a metal core substrate and a metal core printed circuit board free from the above-mentioned drawbacks.

The present invention provides a substrate for a printed circuit board, comprising a metal core plate having apertures and an inorganic fiber cloth impregnated with a heat resistant thermoplastic resin, coated thereon, wherein said apertures are filled with a mixture of said resin and an inorganic filler.

The present invention also provides a printed circuit board comprising a substrate and a printed circuit formed thereon, wherein said substrate comprises a metal core plate having apertures, and an insulating layer formed on each side of the core plate so that the printed circuit is formed on the insulating layer, wherein said insulating layer comprises an inorganic fiber cloth impregnated with a heat resistant thermoplastic resin, and said apertures are coated with an insulating material comprising said resin and an inorganic filler, and a conductive layer formed on said insulating material to form through circuit holes.

Further, the present invention provides a multilayer printed circuit board comprising a plurality of printed circuit units, wherein at least one of said circuit units is the printed circuit board as mentioned above. Namely, according to the present invention, the insulating layer is formed by an inorganic fiber-reinforced heat resistant thermoplastic resin, whereby the high frequency property and the dimensional stability are improved and the retention of foams in the apertures in the core plate can be avoided. Further, an inorganic filler, such as inorganic short fibers or inorganic particles, is incorporated in the resin filled in the apertures, whereby the through-hole platability and the flatness of the insulating layer can be improved.

Now, the present invention will be described in detail with reference to the drawings.

Figure 1:
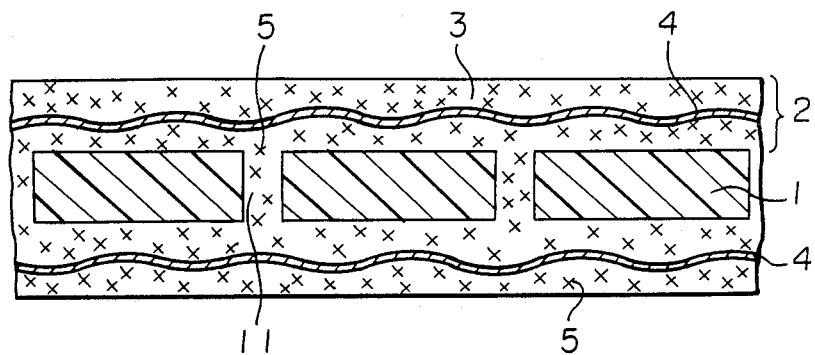
FIG. 1 is a cross-sectional view of an embodiment of a substrate of the present invention.

FIG. 1 is a cross-sectional view of an embodiment of a substrate of the present invention, in which reference numeral 1 designates a metal core plate, numeral 2 designates an insulating layer, numeral 3 designates a heat resistant thermoplastic resin, numeral 4 designates an inorganic fiber cloth and numeral 5 designates an inorganic short fiber.

The metal core plate 1 is made of e.g. aluminum, copper, zinc, iron, silicon steel, or an iron-nickel alloy, and usually has a thickness of from 0.1 to 3.0 mm.

This core plate is preferably the one which has been subjected to surface treatment, such as alumite treatment, chromate treatment, sandblasting, liquid horning or etching treatment.

The core plate 1 is provided with a number of apertures having usually a diameter of from 0.3 to 6.35 mm. The locations of these apertures may vary depending upon the desired circuit, but they may be provided in a pattern of a lattice with a predetermined distance from one aperture to another.

The layer 2 for insulating this core plate 1 comprises a heat resistant thermoplastic resin 3, an inorganic fiber cloth 4 and an inorganic filler 5 such as inorganic short fibers or inorganic particles. The insulating layer preferably has a thickness of from 25 $\mu$m to 1 mm. If the thickness is thinner than 25 $\mu$m, sink marks are likely to form at the portions corresponding to apertures 11, whereby it is difficult to obtain a flat covering layer. On the other hand, if the thickness exceeds 1 mm, the heat dissipation property as a characteristic of the metal core substrate will be lost.

As the heat resistant thermoplastic resin 3, it is possible to employ a polysulfone, polyphenylene oxide, a polyphenylenesulfide, polyether ketone, a polyether ether ketone, a thermoplastic fluororesin, a polyether imide, a polyether sulfone or a polyamide imide, which is resistant to soldering heat.

As the inorganic fiber cloth 4, a usual glass fiber cloth can be employed, and if a lower thermal expansion coefficient is required, a quartz cloth having a $SiO_2$ content of 99% by weight or higher can advantageously be employed. The inorganic fiber cloth usually has a thickness of from 20 to 200 $\mu$m. Such a cloth may be used in a single sheet or in a combination of a few sheets. The inorganic fiber cloth 4 includes a woven cloth and a non-woven cloth, which may be used alone or in combination.

In such an inorganic fiber cloth 4, fibers are intertwined to maintain the strength, and as mentioned above, it is difficult to let them adequately penetrate into apertures 11 of the core plate 1. Therefore, according to the present invention, an inorganic filler 5 such as inorganic short fibers or inorganic particles, is used so that such an inorganic filler can be adequately distributed in the apertures 11.

As the inorganic short fibers 5, usual glass fibers may be employed, which usually have a diameter of from 5 to 20 $\mu$m and a length of from 10 $\mu$m to 6 mm, preferably from 10 to 500 $\mu$m. The amount is usually from 5 to 200 parts by weight, preferably from 20 to 80 parts by weight, relative to 100 parts by weight of the resin in the apertures 11.

As the inorganic particles, glass particles or ceramic particles may be employed. As ceramic particles, molten silica ($SiO_2$), boron nitride (BN), aluminum oxide ($Al_2O_3$), aluminum nitride (AlN) or silicon nitride (SiN) can suitably be employed. When $SiO_2$ is used in combination with a core plate made of an Fe-Ni alloy, it is possible to obtain a low linear expansion coefficient. Whereas, when $Al_2O_3$, AlN or SiN is used in combination with a core plate made of Al or Cu, it is possible to obtain a substrate having an excellent heat dissipation property. The inorganic particles usually have a diameter of from 1 to 100 $\mu$m, and they may be employed in the same amount as in the case of the inorganic short fibers.

The inorganic short fibers and inorganic particles may be used in combination. The content of the above-mentioned inorganic fiber cloth, the inorganic short fibers and the inorganic particles may be from 10 to 80% by weight, preferably from 20 to 60% by weight, based on the total amount including the resin component.

The reason for the improvement in the through-hole platability obtainable by the incorporation of the inorganic filler 5, is believed to be such that fine voids form at the interface between the resin 3 and the filler 5, and such voids serve as anchors for the plating layer, and the thermal expansion coefficient of the resin 3 becomes small so that the difference from that of the plating layer will be minimized.

In the following description, glass short fibers will be used as a typical example. The glass short fibers 5 may be present only in the apertures 11 of the core plate. However, they are preferably distributed throughout the insulating layer 2 as shown in FIG. 1, whereby the property such as platability will be improved.

For the production of such a substrate, a method is employed wherein a powder resin 3 and glass short fibers 5 are mixed, and the mixture is, together with a glass fiber cloth, heat-pressed to a core plate 1 to melt the resin. The molten resin 3 flows together with the glass short fibers 5 into apertures 11 to fill the apertures 11.

In such a case, the resin 3 is preferably as fine as possible, and usually has a particle size of from 2 to 200 $\mu$m.

As an alternative method, a mixture of a powder resin 3 and glass short fibers 5 is firstly melt-pressed to a core plate 1 to fill apertures 11 and at the same time to cover the surface of the core plate 1 with a thin layer, and then a sheet of the resin 3 and a glass fiber cloth 4 are overlaid thereon and subjected to heat-pressing to form a resin-impregnated glass fiber cloth layer.

In this case, the glass short fibers 5 are mainly located in the apertures 11.

The heat-press formation of the insulating layer 2 can be conducted by a pressing method. The pressing operation is preferably conducted in an atmosphere of a reduced pressure at a level lower by at least 600 mmHg, preferably at least 650 mmHg, than the ambient pressure, whereby the retention of foams in the substrate can be minimized. The pressing is conducted at a pressing surface pressure of from 1 to 200 kg/cm$^2$.

The insulating layer 2 is usually provided on both sides of the core plate 1, as shown in FIG. 1, but may be provided on one side only. In a case where a printed circuit (a conductive pattern) is formed by a subtractive method, a conductive film such as a copper foil will be laminated on the layer 2 to obtain a printed circuit substrate board. Another element layer may be provided on at least one side of the above-mentioned metal core substrate or printed circuit substrate board. Such an example will be described with reference to the drawings.

Figure 2:
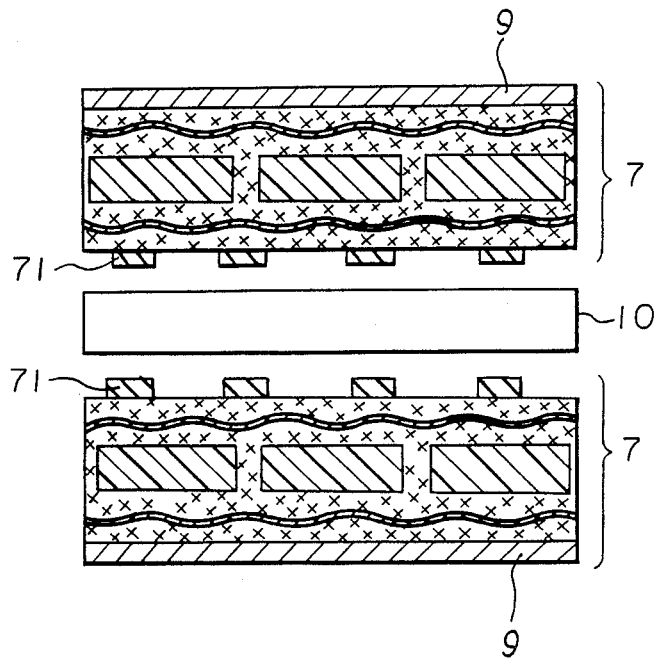
FIG. 2 is a cross-sectional view of an embodiment of a multilayer printed circuit board according to the present invention.

The printed circuit board shown in FIG. 2 comprises printed substrates 7, 7 with an adhesive layer 10 interposed therebetween, wherein each printed substrate is prepared by forming a conductive pattern 71 on one side of the above-mentioned metal core substrate, and metal foils 9, 9 for forming conductive patterns are laminated on the outermost layers on both sides. The printed circuit board shown in FIG. 3 includes an inner layer circuit board 6 provided with a conductive pattern 62 on each side of an insulating substrate 61, and interposed between metal core substrates 7, 7, and metal foils 9, 9 are laminated on the outermost layers at both sides.

For the insulating substrate 61 of the inner layer circuit board 6, a heat resistant thermoplastic resin similar to the one used for the metal core substrate, may be used. As specific examples of such a resin, there may be mentioned resins having a flow initiating temperature of at least 200° C., such as a polysulfone (PSF, flow initiating temperature: 237° C.), a polyphenylenesulfide (PPS, 280° C.), a polyether ether ketone (PEEK, 347° C.), a thermoplastic fluororesin, a polyether imide (PEI, 275° C.), a polyether sulfone (PES, 264° C.), a polyamide imide (PAI, 311° C.) and a polyphenyleneoxide (PPO, 202° C.).

The flow intiating temperature in the present invention is a numerical value obtained by the measurement by means of a flow tester at a temperature rising rate of 3° C./min under a load of 40 kg/cm$^2$ by using a nozzle having an inner diameter of 1 mm and an overall length of 2 mm.

For the above-mentioned thermoplastic resin, a composite material with e.g. a glass filler, a glass cloth or a metal core, may be used within a range not to adversely affect the high frequency property.

On both sides of the insulating substrate 61, conductive patterns 62 are provided. The conductive patterns may be formed, for instance, by etching of a copper foil, and then preferably treated by chemical treatment such as black oxide treatment for the improvement of the adhesion with the adhesive layer. The black oxide treatment is conducted by means of a solution containing sodium chlorite, sodium hydroxide, sodium phosphate, etc.

Figure 3:
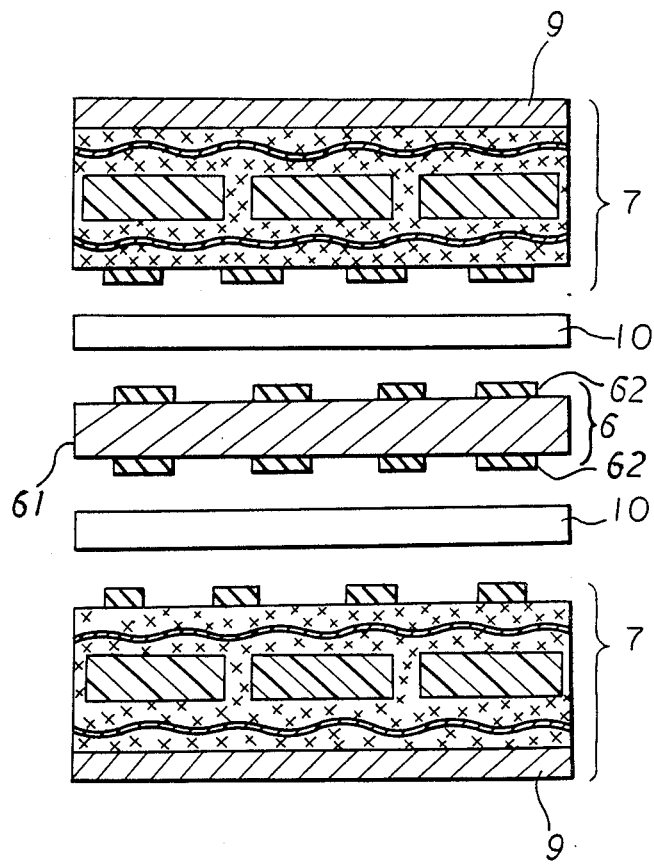
FIG. 3 is a cross-sectional view of another embodiment of a multilayer printed circuit board according to the present invention.
Figure 4:
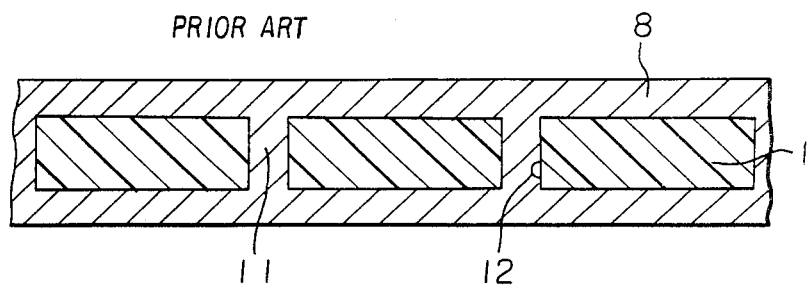
FIG. 4 is a cross-sectional view illustrating a conventional metal core substrate for a printed circuit board.

In the embodiments of FIGS. 2 and 3, metal core substarates 7, 7 and inner layer circuit board 6 are bonded with adhesive layers 10. If the resin used for the adhesive layers 10 is a thermoplastic resin, it is necessary to use a resin having a flow initiating temperature lower than that of the resin used for the metal core substrates and for the above-mentioned insulating substrate 61. Such a resin can be selected from those mentioned as useful for the insulating substrate layer. A thermosetting resin such as glass epoxy or glass imide may be used as the adhesive layer 10.

Here, if the flow initiating temperature of the resin to be used for the adhesive layer 10 is at the same level or higher than the flow initiating temperature of the resin to be used for the metal core substrates 7 or for the insulating substrate 61, there will be the following problems. Namely, when after lamination, the laminate is heat-pressed by a press, the resin for the insulating layer 2 or for the insulating substrate 61 starts to soften simultaneously or prior to the softening of the adhesive layer 10, whereby the conductive pattern on the surface undergoes a deformation, whereby it is difficult to obtain a proper multilayer printed circuit.

By arranging the above-mentioned inner circuit substrate 6 and metal core substrates 7, 7 in the prescribed order, then laminating metal foils 9, 9 on the outermost layers on both sides, and heat-pressing the laminate by e.g. a heat pressing method, a desired multilayer printed circuit board is obtained.

As the metal foils for the outermost layers, copper foils are usually employed.

The condition for heat pressing varies depending upon e.g the type of the heat resistant thermoplastic resin to be used. The press temperature is at least the flow initiating temperature of the resin used for the adhesive layer 10 and lower than the flow initiating temperature of the resin used for the insulating layer 2 and for the insulating substrate 61. The pressing pressure is within a surface pressure of from 10 to 100 kg/cm$^2$, and the pressing is preferably conducted under a reduced pressure at a level lower by at least 730 mmHg than the ambient pressure to prevent the oxidation of the metal foil (9).

The printed circuit substrate board thus obtained is then sent to the next step of producing a printed circuit board. In this step, usual treatments including formation of through holes, resist pattern printing on the metal foil, etching and washing with water are conducted to obtain a final printed circuit board.

The substrate and the printed circuit board according to the present invention have the following excellent characteristics:

(1) When a thermoplastic resin is used as the insulating layer 2 and is permitted to flow into apertures 11 of the core plate to fill the apertures, the formation of foams in the apertures 11 is remarkably minimized as compared with the conventional lamination of a glass epoxy 8 to the core plate 1, although the reason is not clearly understood.

(2) By using the thermoplastic resin, a high frequency property superior to glass epoxy is obtainable. Here, the high frequency property is a property which the dielectric constant ($\epsilon$) or the dielectric dissipation factor (tan $\delta$) shows in a high frequency region of MHz-GHz. The smaller the dielectric constant $\epsilon$, the faster the circuit action. Likewise, the smaller the dielectric dissipation factor tan $\delta$, the smaller the electric loss. Therefore, the smaller the values $\epsilon$ and tan $\delta$ the better the properties. At 1 MHz, the high frequency properties of the glass epoxy are such that $\epsilon$ is from 4.5 to 5.0, and tan $\delta$ is from 0.018 to 0.025, whereas in the case of the above-mentioned heat resistant thermoplastic resin, $\epsilon$ is from 3.0 to 3.8, and tan $\delta$ is from 0.0005 to 0.01, thus indicating that the high frequency properties are extremely good.

(3) The fiber reinforced insulating layer 2 is improved in the heat resistance and dimensional stability over the layer composed solely of the thermoplastic resin, and also improved in the adhesion with the metal core plate and the metal foil.

(4) By the incorporation of the inorganic filler 5 such as glass short fibers, the inorganic filler can be distributed adequately in the apertures 11 of the core plate, whereby the through-hole platability will be improved.

If the resin in the apertures does not adequately contain glass fibers as in the conventional case, the thermal expansion coefficient of the resin in the apertures 11 tends to be greater than that of the insulating layer 2 covering the surface of the core plate 1, whereby sink marks are likely to form on the surface of the insulating layer corresponding to the apertures 11 when the heated resin is cooled. According to the present invention, such a drawback has been overcome, and it is possible to obtain a substrate having an excellent surface flatness. Inorganic short fibers are superior to inorganic particles in this effect for reducing the thermal expansion coefficient.

The substrate of the present invention is suitable as a base material for a single layer or multilayer metal core printed circuit board.

Now, the present invention will be described in further detail with reference to Examples. However, it should be understood that the present invention is by no means restricted to such specific Examples.

EXAMPLE 1

Etching treatment was applied to the surface of aluminum core plate having a thickness of 1 mm and provided with a number of apertures having a diameter of 2 mm, and one of the following five different types of insulating layers having a thickness of about 200 $\mu$m was formed on each side of the core plate to obtain a laminate.

(A) PEI powder and glass short fibers (diameter: 13 $\mu$m, average length: 200 $\mu$m) were mixed in a weight ratio of 7:3. The mixture was impregnated to a glass fiber cloth and heat-pressed to the core plate. The glass fiber content was 40% by weight.

(B) Same as (A) except that PEEK was used instead of PEI.

(C) Same as (A) except that PPS was used instead of PEI.

(D) On the core plate, a glass fiber cloth and a PEEK sheet were sequentially overlaid, and the laminate was heat-pressed to form a resin impregnated glass fiber cloth layer. The glass fiber content was 30% by weight.

(E) On the core plate, an epoxy-resin impregnated glass fiber cloth was overlaid, and the laminate was heat-pressed to cure the impregnated epoxy-resin. The glass fiber content was 40% by weight.

With respect to the laminates (A) to (E), the properties as identified in Table 1 were measured in accordance with the following methods.

(1) Adhesive strength with the core plate:
Measured by peeling at 90° in accordance with JIS C6481.

(2) Through-hole plating strength:
Through holes having a diameter of 1.1 mm were formed within the apertures of the core plate, and an electroless plating layer of copper and an electro-plating layer of copper were sequentially formed on the surface of each through hole without forming a land. A lead wire was inserted in each through hole and soldered with the plating layer. Then, the lead wire was pulled upwardly at a speed of 50 mm/min, whereby the load was measured.

(3) Dielectric constant and dielectric dissipation factor:
Measured at a frequency of 100 MHz at a temperature of 26° C. under a relative humidity of 58% in accordance with a liquid impregnation space varying method (standard solution: silicone oil).

TABLE 1

|  | A | B | C | D | E |
|---|---|---|---|---|---|
| Linear expansion coefficient of the insulating layer ($\times 10^{-5}$) (mm/mm/°C.) | 2.0 | 2.3 | 3.1 | 3.0 | 2.0 |
| Adhesive strength with the core plate (kg/cm) | At least 8 | At least 8 | At least 8 | At least 8 | 2.5 |
| Through-hole plating strength (kg) | 6.5 | 6.0 | 5.7 | 3.9 | 4.9 |
| Dielectric constant ($\epsilon$) | 3.6 | 3.4 | 3.3 | 3.5 | 4.6 |
| Dielectric dissipation factor (tan $\delta$) ($\times 10^{-3}$) | 2.5 | 2.9 | 1.8 | 2.7 | 24.3 |

As is evident from the above results, the laminates (A) to (C) of the present invention have low linear expansion coefficients, and they are excellent in the through-hole platability and in the dielectric properties in a high frequency region.

Whereas, in the laminates (D) and (E), sink marks on the insulating layers were observed at locations corresponding to the apertures of the core plate. Further, in the laminate (E), many foams were observed in the apertures.

EXAMPLE 2

A multilayer printed circuit board having the following specification was prepared by using metal core laminates 7, 7 prepared in a thickness of 0.7 mm in the same manner as in Example 1(B), with the construction as shown in FIG. 2.

Insulating layer: PEEK (flow initiating temperature: 349° C.) containing 30% by weight of a glass cloth, and 20% by weight of glass short fiber (length: 200 $\mu$m, diameter: 13 $\mu$m), thickness: 0.3 mm.

Conductive patterns: Electrolytic copper foil treated by black oxide, thickness of 35 $\mu$m Metal foil: Electrolytic copper foil, thickness: 18 $\mu$m Press: Heating temperature: 290° C., heating time: 5 minutes Pressing conditions: 30 mmHg (i.e. a reduced pressure of lower by 730 mmHg than the ambient pressure) surface pressure: 40 kg/cm$^2$.

The circuit board thus obtained was preferably flat without any deflection or sink marks, and the adjacent layers in the board were firmly bonded to each other. No foams were observed in the apertures.

We claim:

1. A substrate for a printed circuit board, comprising a metal core plate having apertures and an inorganic fiber cloth impregnated with a heat resistant thermoplastic resin, coated thereon, wherein said apertures are filled with a mixture of said resin and an inorganic filler, wherein said inorganic filler comprises short glass fibers having a diameter of from 5 to 20 $\mu$m and a length of from 10 $\mu$m to 6 mm.

2. The substrate according to claim 1, wherein the thermoplastic resin is selected from the group consisting of a polysulfone, polyphenylene oxide, polyphenylene sulfide, polyether ketone, polyether ether ketone, a thermoplastic fluororesin, a polyether imide, polyether sulfone and polyamide imide.

3. The substrate according to claim 1, wherein the metal core plate is made of aluminum, copper, zinc, iron, silicon steel or an iron-nickel alloy.

4. The substrate according to claim 1, wherein the inorganic fiber cloth is a glass cloth or a quartz cloth.

5. The substrate according to claim 1, which further includes a conductive layer formed on at least one side of the substrate.

6. The substrate according to claim 1, wherein the amount of said inorganic filler is from 5 to 200 parts by weight relative to 100 parts by weight of the resin.

7. The substrate according to claim 1, wherein the amount of said inorganic filler is from 20 to 80 parts by weight relative to 100 parts by weight of the resin.

8. The substrate according to claim 1, wherein the length of the short glass fibers is from 10 $\mu$m to 500 $\mu$m.

9. A printed circuit board comprising a substrate and a printed circuit formed thereon, wherein said substrate comprises a metal core plate having apertures, and an insulating layer formed on each side of the core plate so that the printed circuit is formed on the insulating layer, wherein said insulating layer comprises an inorganic fiber cloth impregnated with a heat resistant thermoplastic resin, and said apertures are coated with an insulating material comprising said resin and an inorganic filler, and a conductive layer formed on said insulating material to form through circuit holes, wherein said inorganic filler comprises short glass fibers having a diameter of from 5 to 20 $\mu$m and a length of from 10 $\mu$m to 6 mm.

10. A multilayer printed circuit board comprising a plurality of printed circuit units, wherein at least one of said circuit units is the printed circuit board as defined in claim 9.

11. The printed circuit board according to claim 9, wherein the amount of said inorganic filler is from 5 to 200 parts by weight relative to 100 parts by weight of the resin.

12. The printed circuit board according to claim 9, wherein the amount of said inorganic filler is from 20 to 80 parts by weight relative to 100 parts by weight of the resin.

13. The printed circuit board according to claim 9, wherein the length of the short glass fibers is from 10 $\mu$m to 500 $\mu$m.

* * * * *